United States Patent [19]
Bartholomew

[11] Patent Number: 6,084,422
[45] Date of Patent: Jul. 4, 2000

[54] PRINTED CIRCUIT BOARD TESTING DEVICE

[76] Inventor: Mark Bartholomew, 1354 S. Parkside Pl., Ontario, Calif. 91761

[21] Appl. No.: 08/966,757

[22] Filed: Nov. 10, 1997

[51] Int. Cl.[7] .................................................. G01R 31/02
[52] U.S. Cl. ........................................... 324/761; 324/754
[58] Field of Search ........................... 324/761, 754–755, 324/158.1, 72.5, 73.1

[56] References Cited

U.S. PATENT DOCUMENTS

| | | |
|---|---|---|
| 4,818,933 | 4/1989 | Kerschner et al. ...................... 324/754 |
| 5,311,120 | 5/1994 | Bartholomew . |
| 5,436,567 | 7/1995 | Wexler et al. ........................... 324/754 |
| 5,889,407 | 3/1999 | Nucci ...................................... 324/754 |

*Primary Examiner*—Josie Ballato
*Assistant Examiner*—Minh Tang
*Attorney, Agent, or Firm*—Sheldon & Mak; Denton L. Anderson

[57] ABSTRACT

An improved device for testing electrical circuit tracings on a printed circuit board is provided. The device includes a first plate, a second plate and connecting elements for connecting the first and second plates to one another, such that one or both of the plates can be moved relative to one another such that one or both of the plates can be moved relative to the other between a distal position wherein the plates are distal to one another and a proximal plate position wherein the plates are proximal to one another. The device further includes retaining device, which preferably is a pull-out tray, for retaining a printed circuit board between and substantially parallel to the first and second plates and a plurality of test probes disposed either above the retaining device and/or below the retaining device. The test probes are disposed so as to contact a trace on a circuit board being tested when that circuit board is disposed on the retaining device and when the plates are in the proximal plate position. The connecting elements include a motor operatively connected to at least one of the plates by a pair of horizontally slidable cam bars which are attached to at least one of the plates by a cam follower connection. By this configuration, the operation of the motor causes movement of at least one of the plates between the distal and proximal plate positions.

10 Claims, 8 Drawing Sheets

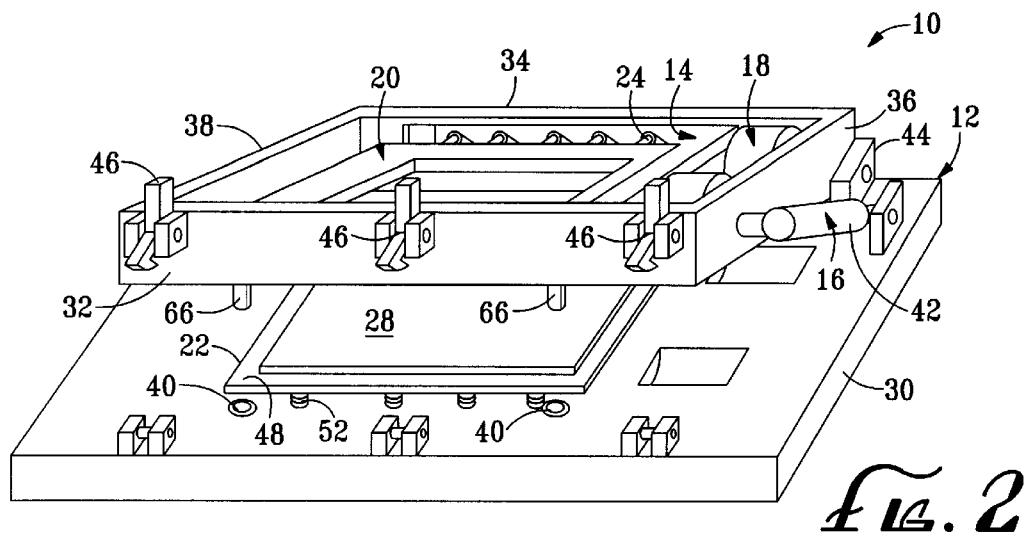
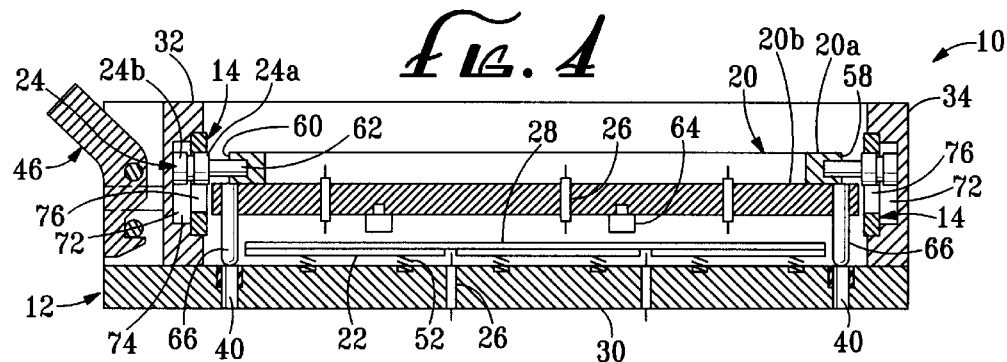
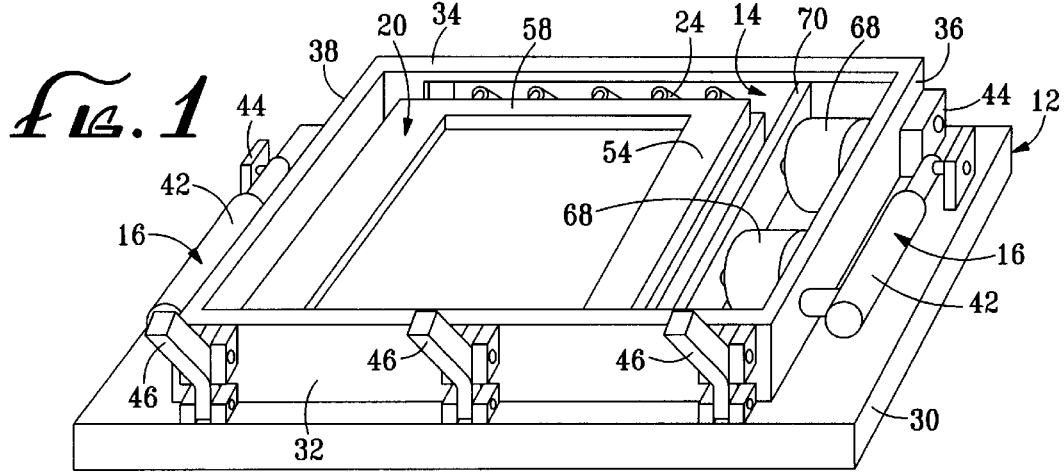

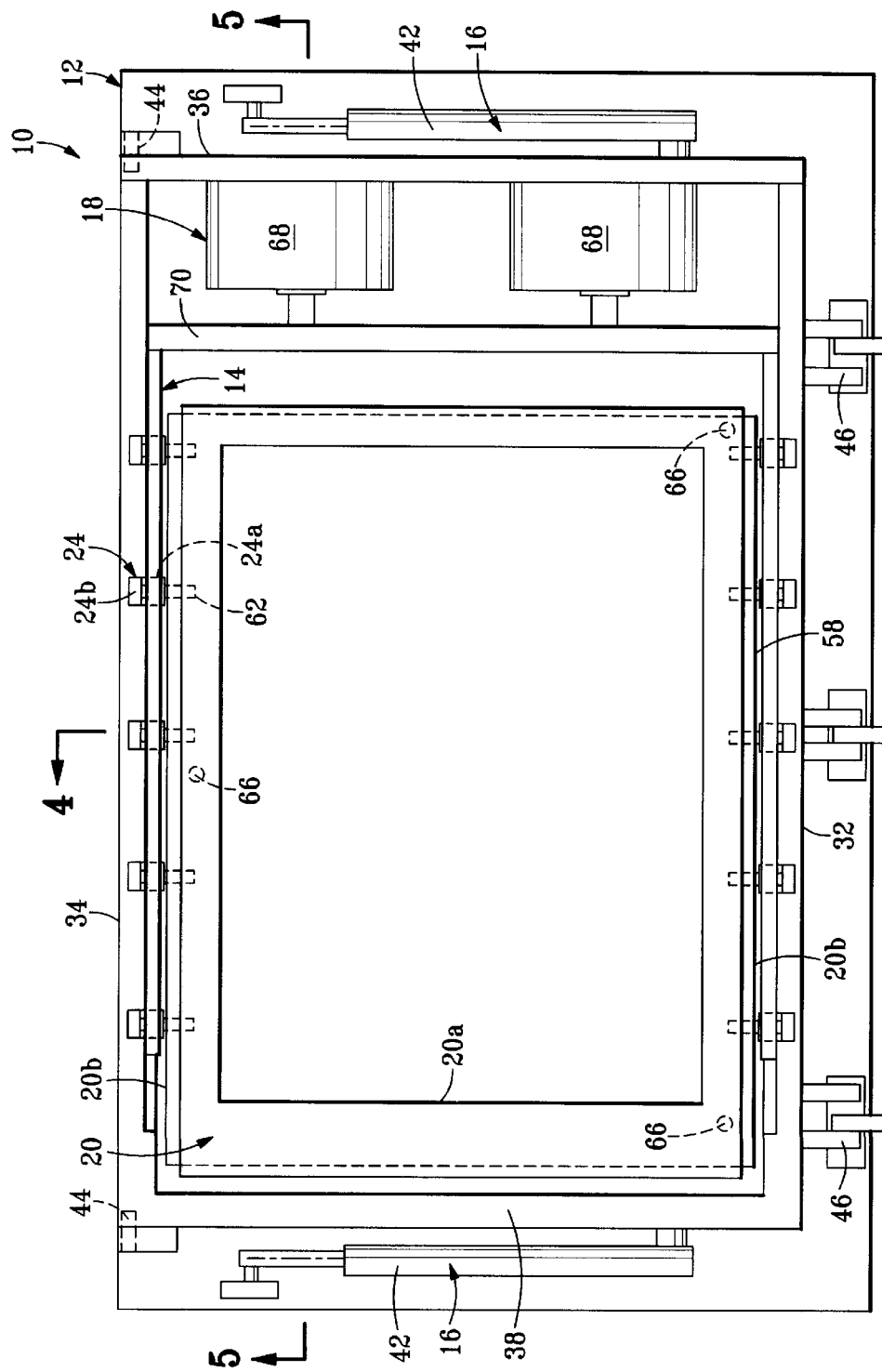

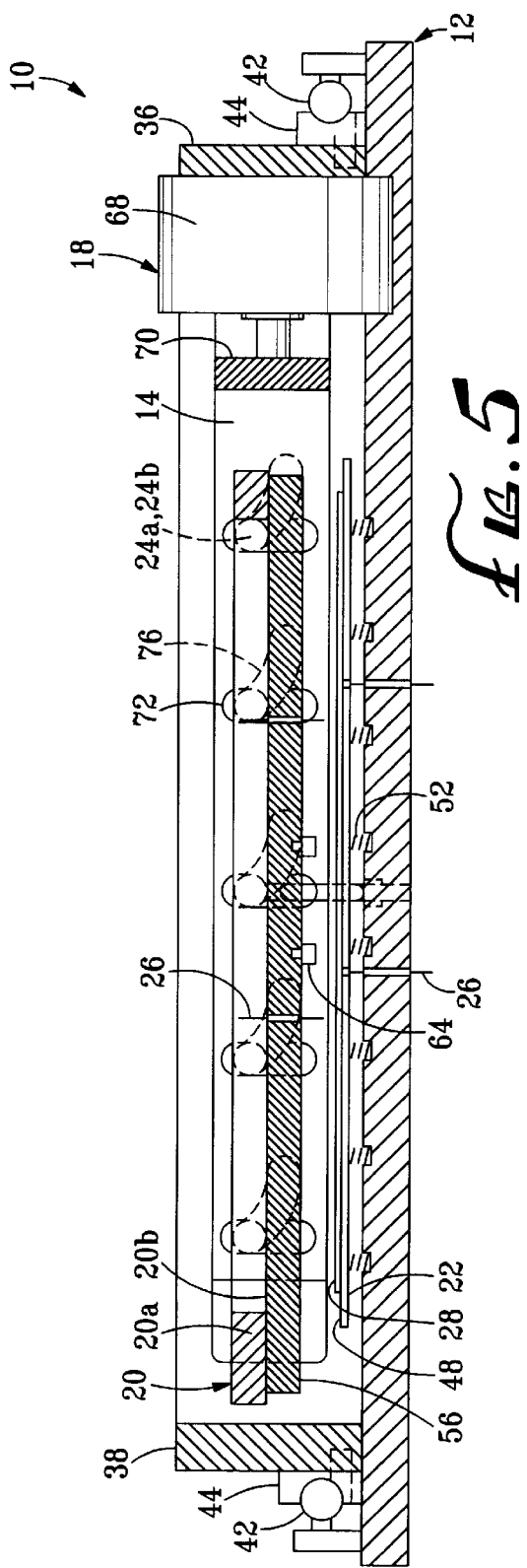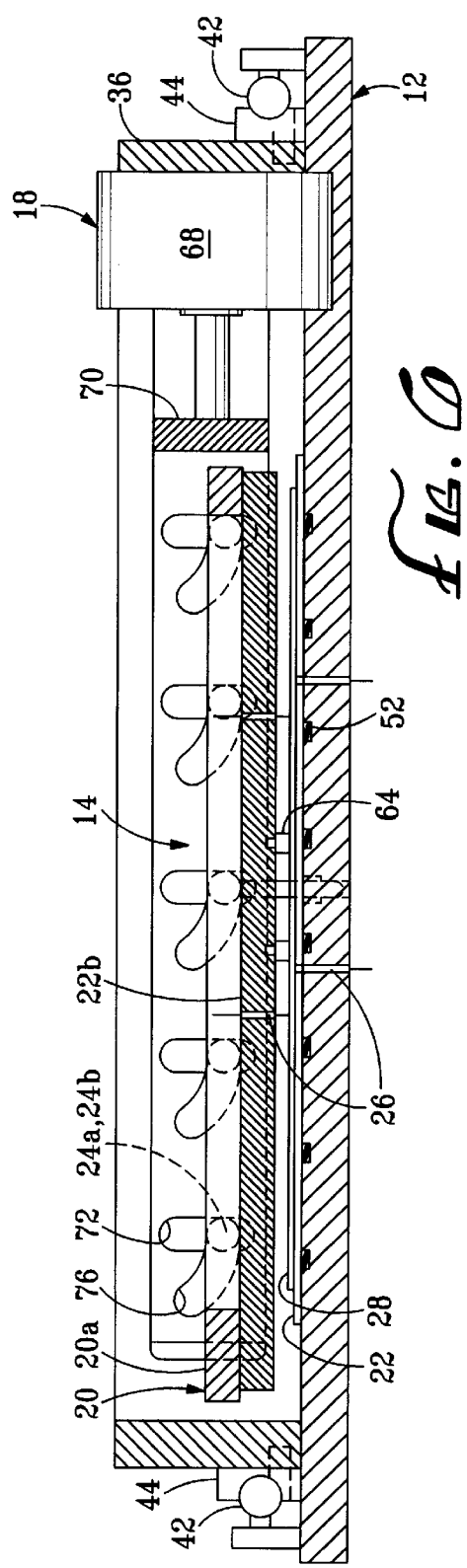

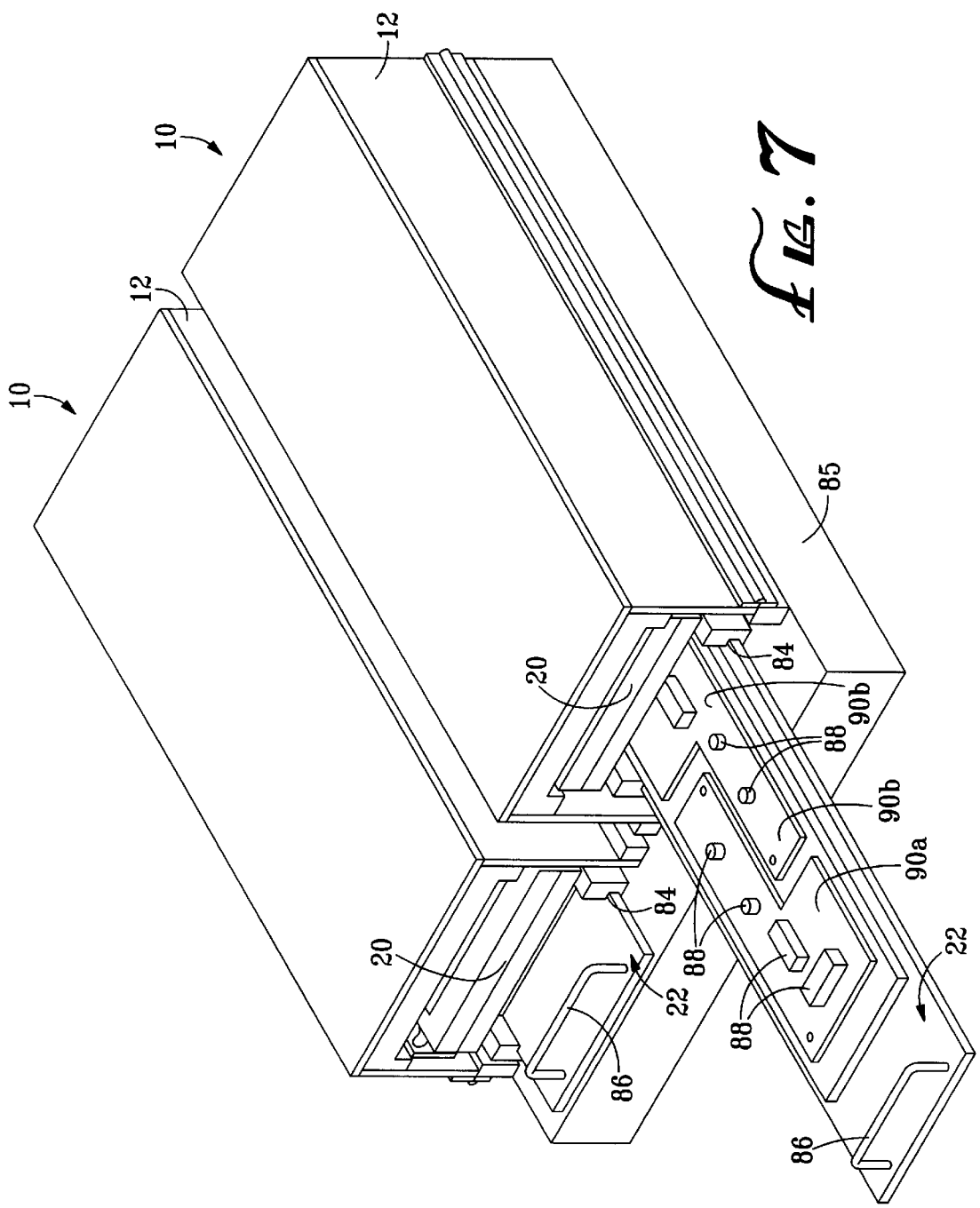

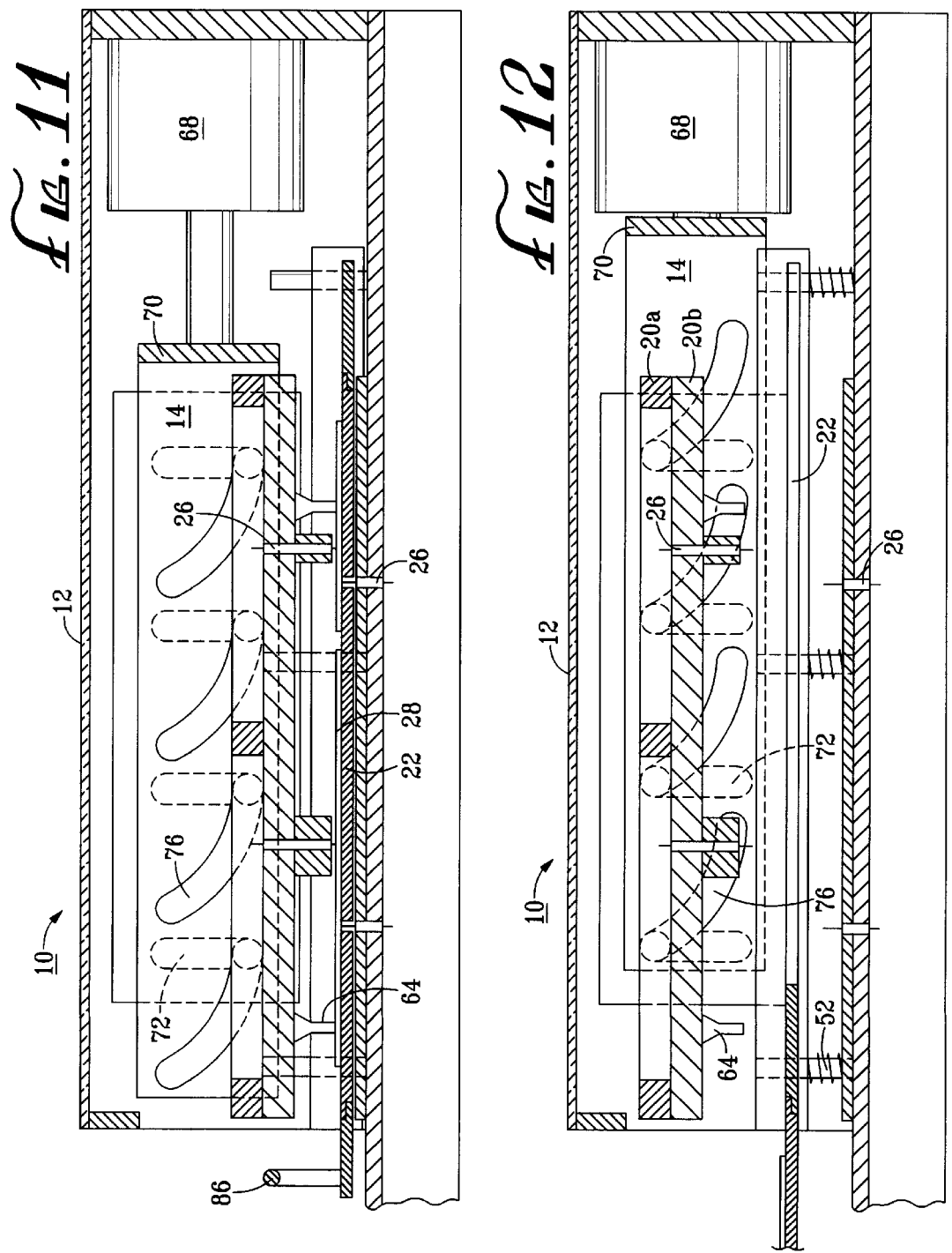

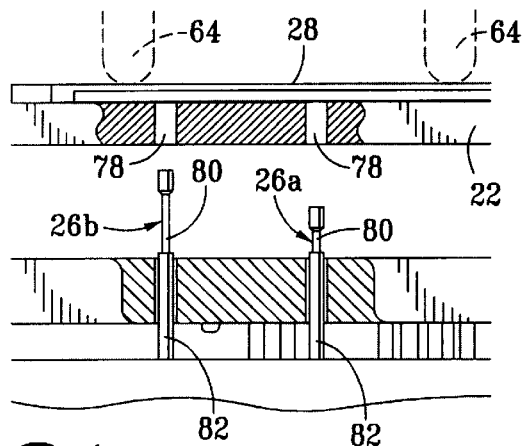
_fig. 13_
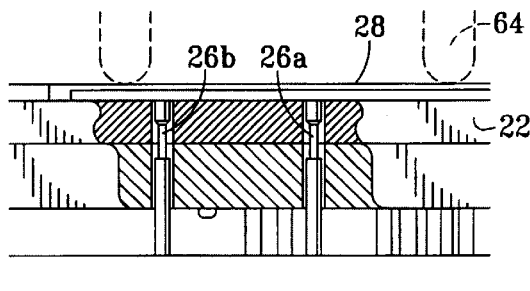
_fig. 14_
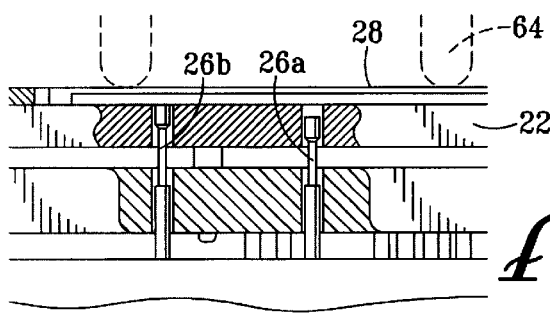
_fig. 15_
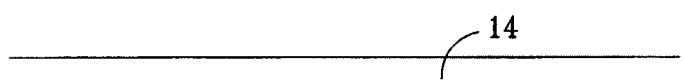
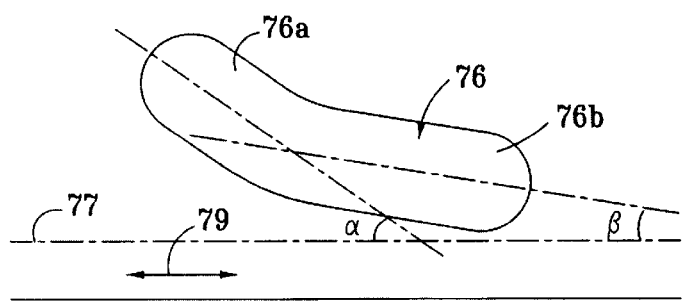
_fig. 16_

6,084,422

PRINTED CIRCUIT BOARD TESTING DEVICE

FIELD OF THE INVENTION

This invention relates generally to circuit board testing equipment and, more specifically, to circuit board testing equipment comprising a plurality of test probes affixed in the equipment so as to match up with critical elements on a printed circuit board being tested.

BACKGROUND

Printed circuit boards are an increasingly common component in all types of electronic devices. It is customary practice in the circuit board industry to conduct an integrity test on each newly manufactured printed circuit board to check for broken or disconnected circuits. Integrity testing entails making electrical contact between a number of predetermined locations on the printed circuitry and specially adapted electrical diagnostic equipment. The equipment measures an integrity parameter at predetermined locations on the printed circuit board and compares the measurements with standard values.

Besides integrity testing, printed circuit boards are frequently subjected to functionality testing. Functionality testing entails placing test probes into contact with the input and output of the printed circuit board, and into contact with specific predetermined locations along the printed circuit board.

Therefore, both integrity and functionality testing, as well as other types of analyses, require contact between test probes and the printed circuit board. This contact must be precise, and must be made in a manner which will not damage the printed circuit boards.

In U.S. Pat. No. 5,311,120, I described a particular test fixture suitable for testing printed circuit boards, both for integrity and functionality. Although the test fixture disclosed in U.S. Pat. No. 5,311,120 has been found to be a major improvement over prior art devices, problems still remain. One such problem is that the driving mechanism for moving the printed circuit board into contact with the test probes is provided by a number of hydraulic pistons which apply pressure at a relatively small number of points on the plate holding the printed circuit board. Such driving mechanism is not as solid and precise as desirable.

Another problem is that the physical size of test fixtures such as disclosed in U.S. Pat. No. 5,311,120—which opens upwardly (like a suitcase)—take up an excessive amount of physical space within a user's test facility.

Accordingly, there is a need for a test fixture capable of inexpensively and efficiently testing printed circuit boards which is at once compact, rigid and precise in operation.

SUMMARY OF THE INVENTION

This invention satisfies this need. The invention is a device for testing circuit tracings on a circuit board comprising: (a) a first plate; (b) a second plate disposed substantially parallel with the first plate; (c) connecting means for connecting the first and second plates disposed within the housing, the second plate being disposed substantially parallel with the first plate; (d) retaining means for retaining a printed circuit board between, and substantially parallel to, the first and second plates; and (e) at least one test probe disposed in one of the plates such that the test probe contacts a trace on a circuit board disposed on the retaining means when the plates are in the proximal plate position. The connecting means includes a driver operatively connected to at least one of the plates by a cam and cam follower connection, such that operation of the driver causes movement of at least one of the plates between the distal and the proximal plate positions.

In a typical embodiment of the invention, both the first and second plates comprise a plurality of test probes arranged generally in parallel in such a way that the test probes will make contact with a printed circuit board disposed within the retaining device.

It is also typical that the device further comprises a test apparatus electrically connected to the test probe for testing at least one parameter related to the trace on the circuit board.

In a preferred embodiment, the linking structure comprises a pair of sliding bars disposed in parallel and opposite sides of the first and second plates. The sliding bars are operatively attached to a motor capable of reciprocating the sliding bars in unison. Both of the sliding bars are attached to at least one of the plates.

In another preferred embodiment, the second plate has an upper surface and a lower surface and the retaining device is a tray affixed to the upper surface of the second plate. The tray is typically movable in a horizontal direction to allow quick and easy access to the retaining device.

The invention provides a compact test fixture for rapidly testing the integrity and functionality of printed circuit boards. Unlike prior art test fixtures, the invention is highly compact and structurally quite rigid. This provides for a high degree of precision and reproducibility in operation.

DRAWINGS

These and other features, aspects and advantages of the present invention will become understood with reference to the following description, appended claims and accompanying drawings, wherein:

FIG. 1 is a top perspective view of a device having features of the present invention with the housing in the closed position;

FIG. 2 is selected from the group consisting of a top perspective view of a device having features of the present invention with the housing in the open position to admit a printed circuit board;

FIG. 3 is a top plan view of the device of FIG. 2;

FIG. 4 is a side cross-sectional view of the device of FIG. 3, taken along line 4—4, showing the first plate in the first plate position;

FIG. 5 is a front cross-sectional view of the device of FIG. 3, taken along the line 5—5 showing the distal plate in the first plate position;

FIG. 6 is a front cross-sectional side view of the device of FIG. 3, the first plate in the proximal plate position;

FIG. 7 is a perspective view of an alternative pair of devices having features of the invention;

FIG. 11 is a cross-sectional side view of the devices illustrated in FIG. 8 taken along line 11—11, the first full plate being shown in a lower position;

FIG. 12 is a cross-sectional side view of the devices illustrated in FIG. 8 taken along line 12—12, the first plate being shown in an upper position;

FIG. 13 is a detail cross-sectional view of first and second plates useful in the invention, the plates being shown disposed in a distal plate position;

FIG. 14 is a detail cross-sectional view of the first and second plates illustrated in FIG. 13, the plates being shown in a proximal position;

FIG. 15 is a detail cross-sectional view of the first and second plates illustrated in FIG. 13, the plates being shown in an intermediate position; and FIG. 16 is a detail side view of a cam useful in the invention.

DESCRIPTION

Figure 8:
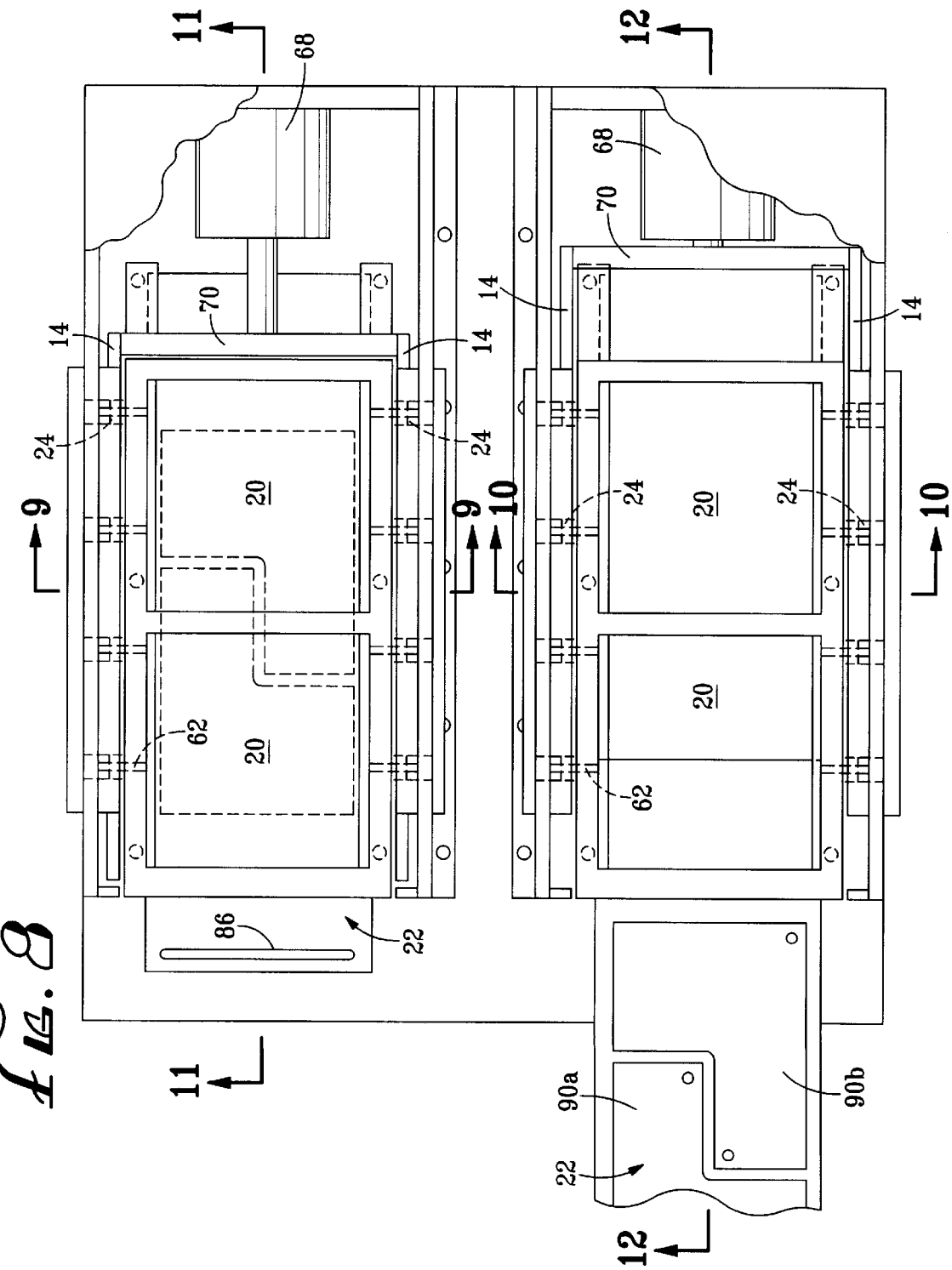
FIG. 8 is a plan view in partial cross-section of the devices illustrated in FIG. 7.

The invention is a device 10 for testing circuit tracings on a printed circuit board 28. The device 10 comprises a first plate 20, a second plate 30, connecting means for connecting the first and second plates 20 and 30 to one another and retaining means for retaining the circuit board 28 between the first and second plates 20 and 30.

In one embodiment of the invention illustrated in FIGS. 1–6, the device 10 comprises a frame structure 12 having a front wall 32, an opposing back wall 34, a first side wall 36 and an opposing side wall 38.

An opening mechanism 16 is provided to allow the frame structure 12 to be movable to provide access to the circuit board retaining means. In a preferred configuration as shown in the drawings, the opening mechanism 16 comprises at least one pneumatic spring 42 and a plurality of hinges 44. Other suitable opening mechanisms are also possible. The device 10 can further comprise at least one latch 46 for maintaining the frame structure 12 in a closed position.

The first plate 20 has an upper surface 54 facing away from the second plate 30, a lower surface 56 facing toward the second plate 30, a first plate front edge 58 facing the front wall 32 and a first plate back edge 60 facing the back wall 34. As shown in the drawings, the first plate 20 can itself comprise a composite of two contiguous plates 20a, 20b affixed to each other. The second plate 30 has an upper surface 49 facing toward the first plate 20. Preferably, the first plate 20 further comprises a plurality of guide pins 66, aligned with the guide pin receptacles 40 in the second plate 30.

As shown for the embodiments illustrated in the drawings, the support plate 22 can be affixed to the second plate 30 by connectors 52, such that the support plate 22 is substantially parallel with the second plate 30. In a preferred embodiment shown in FIGS. 5 and 6, the connectors 52 comprise springs which allow some movement of the support plate 22 in a vertical direction. The springs bias the support plate 22 away from the second plate 30. The upper surface 48 of the support plate 22 provides retaining means for receiving and retaining a printed circuit board 28 in a disposition substantially parallel to the first and second plates 20 and 30.

Either the first plate 20, the second plate 30, or, preferably, both, include at least one test probe 26 suitable for testing the electrical circuit tracings on a printed circuit board 28. In a typical embodiment such as is illustrated in the drawings, both the first plate 20 and the second plate 30 comprise a plurality of test probes 26, each positioned to be aligned with a location on a trace on a printed circuit board 28 to be tested.

As shown in FIG. 3, cam follower pairs 24 are attached to the front edge 58 and to the back edge 60 of the first plate 20. Each of the cam follower pairs 24 are connected to the first plate 20 by a cam shaft 62. Each cam follower pair 24 comprises an inner cam follower 24a and an outer cam follower 24b which are axially displaced as shown in the drawings along the cam shaft 62. In the embodiment shown in FIGS. 1–6, five cam follower pairs 24 are disposed substantially equally spaced apart along both the front edge 58 and the back edge 60 of the first plate 20.

The outer cam followers 24b are movably affixed within corresponding vertical grooves 72 defined within the front wall 32 and within the back wall 34. Accordingly, in the embodiments shown in FIGS. 1–6, five vertical grooves 72 are defined in each wall 32 and 34. The interaction of the outer cam followers 24b within the vertical groove 72 retains the first plate 20 within the housing 12 but allows the first plate 20 to move up and down along the length of the vertical grooves 72. In a typical embodiment, the length of the vertical grooves 72 can be about 1½ inches.

The inner cam followers 24a are disposed within and adapted to follow cams 76 defined within a pair of opposed sliding cam bars 14. The cam bars 14 are slidably affixed within cam bar tracks 74 defined within the front wall 32 and the back wall 34. For the embodiment illustrated in FIGS. 1–6, this is best seen in FIGS. 4–6.

Each of the opposed cam bars 14 has a number of cams 76 defined therein, the number corresponding to the number of cam follower pairs 24 disposed along each edge of the first plate 20. Accordingly, in the embodiment illustrated in FIGS. 1–6, the number of cams 76 in each cam bar 14 is five, corresponding to the five cam follower pairs 24 disposed on each edge of the first plate 20.

As the first plate 20 is moved towards the proximal plate position, the first plate 20 contacts a printed circuit board 28 disposed on the support plate 22 via contact elements 64 disposed on the underside of the first plate 20. As the first plate 20 continued downwardly toward the proximal plate position, the support plate 22 is thereby pressed downwardly by the contact elements 64 against the biasing pressure of the connectors 52 so as to contact the test probes 26 in the second plate 30.

Preferably, the cams 76 have at least two cam bar moieties 76a and 76b. Cam bar moiety 76a is disposed at an angle between about 35° and about 55° with respect to a line 77 which is parallel with the direction of travel 79 of the cam bars 14. A 45° angle provides a mechanical advantage of about 1:1. Cam bar moiety 76b is disposed at an angle β between about 3° and about 15° with respect to the line 77, disposed parallel with the direction of travel 79 of the cam bars 14. An angle β of about 9° provides a mechanical advantage of about 5:1, and an angle β of about 5° provides a mechanical advantage of about 9:1. The length of the cam bar moieties 76a and 76b are chosen to push the printed circuit board downwardly until the probes 26 have been compressed to a predetermined compression, such as to about two thirds of full stroke, which is presently the industry standard recommended by probe manufacturers.

The cam bar 14 can be moved back and forth laterally in unison by a driver 18. The driver 18 can comprise any of a variety of components as will be understood with skill in the art with reference to the disclosure herein. In the embodiment illustrated in the drawings, the driver 18 comprises a pair of pneumatic cylinders 68 which each operate against a push plate 70 attached to one end of each of the cam bars 14.

Figure 9:
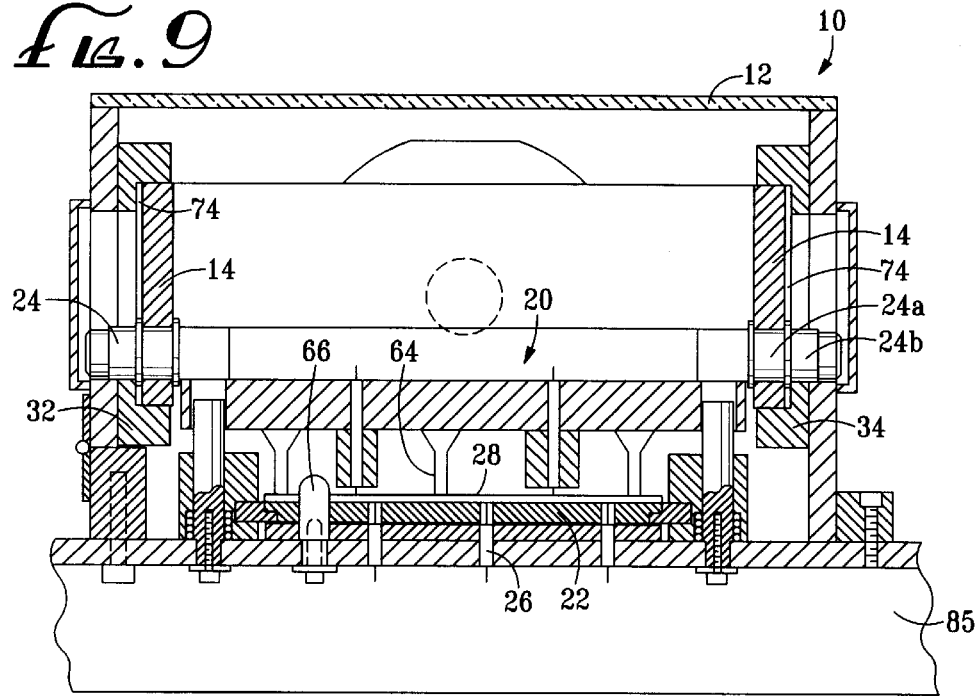
FIG. 9 is a cross-sectional view of the devices illustrated in FIG. 8 taken along line 9—9.
Figure 10:
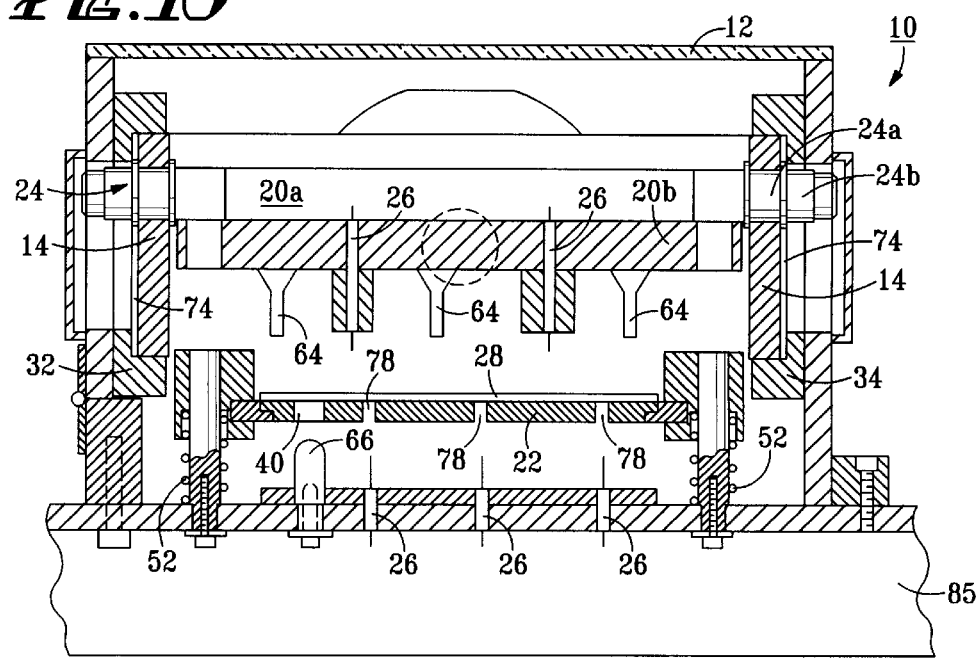
FIG. 10 is a cross-sectional view of the devices illustrated in FIG. 8 taken along line 10—10.

FIGS. 7–12 illustrate a preferred embodiment of the invention wherein the support plate 22 is adapted as a tray which can be slid horizontally along tray tracks 84 to give the operator access to the circuit board retaining means. This embodiment provides considerable advantage over the prior art because no structure has to be opened upwardly to gain access to the circuit board retaining means. This significantly reduces the amount of work space required to use the device 10 and results in a more rigid construction.

In the embodiment shown in FIGS. 7–12, a pair of testing devices 10 are mounted on a common platform 85. Each device 10 has a support plate 22 which slides outwardly as a tray along the tray tracks 84. A pull-out handle 86 is conveniently attached to the leading edge of the support plate 22 to allow easy movement of the support plate 22.

In the embodiment illustrated in FIGS. 7–12, each support plate 22 comprises a pair of circuit board retaining means, each comprising support elements 88 for supporting and retaining a circuit board 28 for testing. The two circuit board retaining means are illustrated as 90a and 90b.

In all embodiments, the test probes 26 are affixed to the first plate 20 and/or the second plate 30 so as to be perpendicular to a circuit board 28 disposed on the retaining means on the support plate 22. Each of the test probes 26 disposed in the second plate 30 is aligned with a corresponding aperture 78 in the support plate 22 so that, when the first and second plates 20 and 30 are moved to the proximal plate position, each probe 26 protrudes through a corresponding aperture 78 in the support plate 22 to contact traces on the underside of the circuit board 28.

In a typical embodiment, each of the probes 26 has a diameter between about 0.025 inches and about 0.125 inches. Preferably, the test probes 26 disposed in the second plate 30 are comprised of a plurality of short probe members 26a having a first probe height and a plurality of long probe members 26b having a second probe height. Each of the test probes 26 has an inner moiety 80 telescopically disposed within an outer moiety 82. The height of the long probe members 26b is thereby telescopically alterable between the second probe height and the lesser probe height, which is at least as short as the first probe height. The test probes 26 also have internal biasing means (not shown) for urging the inner moiety 80 away from the outer moiety 82. This biasing means is generally provided by a small coiled spring disposed within the outer moiety 82 and adapted to apply pressure to the bottom of the inner moiety 80 so as to urge the inner moiety 80 away from the base of the outer moiety 82. In the short probe members 26a, such biasing means urge each of the short probe members 26a to the first probe height. In the long probe members 26b, such biasing means urge each of the long probe members 26b to the second probe height.

The first probe height and the second probe height are not critical, so long as the first probe height is sufficient to allow the short probe members 26a to traverse the thickness of the second plate 30 and to make contact with the circuit tracings on the printed circuit board 28 when the plates 20 and 30 are in the proximal plate position. In a typical embodiment, the first probe height is between about 0.4 and about 0.625 inches, and the second probe height is between about 0.65 ad about 0.8 inches.

The use of a combination of short probe members 26a and long probe members 26b allow the device 10 to used for both integrity testing (using all of the probes 26) and functionality testing (using only the long probe members 26b). The use of short and long probe members 26a and 26b in a combination test device is described in detail in U.S. Pat. No. 5,311,120, the entirety of which is incorporated herein by this reference.

Each of the test probes 26 is electrically connected to suitable electrical signal diagnostic equipment (not shown) designed and adapted to receive an electrical signal from each of the predetermined points along the circuit tracing via the test probes 26 and comparing each of those signals to a standard value. Each of the test probes 26, therefore, is connected to the electrical signal diagnostic equipment by suitable connection means. Such means can comprise any of the many ways of completing an electrical circuit, including wires, circuit tracings, ribbon cable, etc.

In operation, the device 10 is used for testing electrical circuit tracings on a printed circuit board 28 as follows. First, the device 10 is opened and the circuit board 28 to be tested is placed on the retaining means. For embodiments illustrated in FIGS. 1–6, this is accomplished by unlatching latch 46 to permit opening of the frame structure 12. The opening mechanism 16 is then actuated causing the frame structure to lift off the second plate 30 from the closed position shown in FIG. 1 to the open position shown in FIG. 2. Once the frame structure 12 is in the open position, a printed circuit board 28 is placed on the support plate 22. The frame structure 12 is then moved again into the closed position as shown in FIG. 1. For embodiments illustrated in FIGS. 7–12, the opening of the device 10 and the setting of the circuit board 28 is more simply accomplished by merely sliding out the support plate 22 using the handle 86 and placing the circuit board 28 to be tested on the retaining means.

After the device 10 is opened, the driver 18 is actuated, causing the cam bars 14 to move along the cam bar tracks 74 within the front wall 32 and back wall 34. This movement causes the first plate 20 to move relative to the second plate 30 from the distal plate position (as illustrated in FIGS. 4, 5, 10, 12 and 13) to the proximal plate position (as illustrated in FIGS. 6, 9, 11 and 14) by the interaction of the movement of cam follower pairs 24 within the vertical grooves 72 and the cams 76. As the first plate 20 moves toward the proximal plate position, the contact elements 64 contact the printed circuit board 28 thereby causing the printed circuit board 28 and support plate 22 to move toward the second plate 30 against the biasing pressure of the connectors 52.

Once the first plate 20 has fully moved into the proximal plate position, each of the test probes 26 are brought into contact with predetermined trace points along the printed circuit board 28 being tested. In the proximal plate position, each of the test probes 26 is typically used to perform an integrity test on the printed circuit board 28.

After the integrity test is completed, the first and second plates 20 and 30 can be retracted slightly to an intermediate position as illustrated in FIG. 15. In the intermediate plate position, the long probe members 26b, but not the short probe members 26a, remain in contact with trace points on the printed circuit board 28. Typically, the long probe elements 26b are then used to perform a functionality test on the printed circuit board 28.

Once all tests are complete, the driver 18 is actuated to move the first plate 20 back to the distal plate position, and the circuit board 28 is removed from the device 10.

Although the present invention has been discussed in considerable detail with reference to certain preferred embodiments thereof, other embodiments are possible. For example, although the embodiments illustrated herein comprise a movable first plate and a relatively stationary second plate, other embodiments could comprise a movable second plate (having cam follower pairs attached thereto) and a relatively stationary first plate. Therefore, the spirit and scope of the appended claims should not be limited to the description of the preferred embodiments contained herein.

What is claimed is:

1. A device for testing circuit tracings on a printed circuit board comprising:
    (a) a first plate;
    (b) a second plate disposed substantially parallel with the first plate;
    (c) connecting means for connecting the first and second plates to one another such that one or both of the plates can be moved relative to the other between a distal plate position wherein the plates are distal to one another and a proximal plate position wherein the plates are proximal to one another, the connecting means including a driver operatively connected to at least one of the plates by a cam and cam follower connection such that operation of the driver causes movement of at least one of the plates between the distal and proximal plate positions, the connecting means comprising a pair of sliding cam bars disposed in parallel on opposite sides of the first and second plates, the cam bars being operatively attached to a motor capable of reciprocating the cam bars in unison, the cam bars each having at least one cam defined therein for retaining an inner cam follower attached to one of the plates of the devices
    (d) retaining means for retaining a printed circuit board between, and substantially parallel to, the first and second plates; and
    (e) at least one test probe disposed in one of the plates such that the test probe contacts a trace on a circuit board disposed on the retaining means when the plates are in the proximal plate position.

2. The device of claim 1 wherein each cam bar has a plurality of cams and wherein each cam retains an inner cam follower attached to one of the plates of the device.

3. The device of claim 1 wherein the device comprises a first vertical wall and an opposed second vertical wall and wherein a plurality of vertical grooves is defined in both the first and second vertical walls, each vertical groove being dimensioned and configured to retain an outer cam follower disposed adjacent to an inner cam follower, so that, when the cam bars are reciprocated by the motor, the interaction of the inner cam followers within the cams and the outer cam followers within the vertical groove causes the plates to move relative to one another between the distal plate position and the proximal plate position.

4. The device of claim 3 wherein the cam comprises a first cam moiety disposed at an angle with respect to a line parallel with the direction of movement of the cam bars of between about 35° and about 55°, and a second cam moiety disposed at an angle with respect to a line parallel with the direction of movement of the cam followers between about 5° and about 15°.

5. A device for testing circuit tracings on a printed circuit board comprising:
    (a) a frame structure comprising a pair of opposed vertical walls including a first vertical wall and an opposed second vertical wall;
    (b) a first horizontal plate disposed within the frame structure;
    (c) a second horizontal plate disposed stationary and substantially in parallel to the first plate;
    (d) connecting means for connecting the first and second plates to one another such that one or both of the plates can be moved relative to the other between a distal plate position wherein the plates are distal to one another and a proximal plate position wherein the plates are proximal to one another, the connecting means comprising a pair of sliding cam bars disposed in parallel on opposite sides of the first and second plates, the cam bars being operatively attached to a motor capable of reciprocating the cam bars in unison, the cam bars each having at least one cam defined therein for retaining an inner cam follower attached to one of the plates of the device, and wherein a plurality of vertical grooves is defined in both the first and second walls, each vertical groove being dimensioned and configured to retain an outer cam follower disposed adjacent to an inner cam follower so that, when the cam bars are reciprocated by the motor, the interaction of the inner cam followers within the cams and the outer cam followers within the vertical grooves causes the plates to move relative to one another between the distal plate position and the proximal plate position;
    (e) a support plate for retaining a printed circuit board between, and substantially parallel to, the first and second plates;
    (f) a plurality of vertical test probes disposed in the first plate such that the test probes contact a trace on a circuit board disposed on the support plate when the plates are in the proximal plate position; and
    (g) a plurality of test probes disposed in the second plate.

6. The device of claim 5 wherein the support plate is a slidable tray.

7. The device of claim 5 further comprising a test apparatus electrically connected to the test probe for testing at least one parameter related to the trace on the circuit board.

8. A device for testing circuit tracings on a printed circuit board comprising:
    (a) a first plate:
    (b) a second plate disposed stationary and substantially parallel with a first plate;
    (c) a support plate disposed between the first plate and the second plate and substantially parallel therewith, the support plate having a top surface and a bottom surface and being horizontally slidable, such that the support plate can be slid horizontally to allow access to the top surface of the support plate;
    (d) connecting means for connecting the first and second plates to one another, such that one or both of the plates can be moved relative to the other between a distal plate position wherein the plates are distal to one another and a proximal plate position wherein the plates are proximal to one another, the connecting means comprising a pair of sliding cam bars disposed in parallel on opposite sides of the first and second plates, the cam bars being operatively attached to a motor capable of reciprocating the cam bars in unison, the cam bars each having at least one cam defined therein for retaining an inner cam follower attached to one of the plates of the device, wherein each cam bar has a plurality of cams and wherein each cam retains an inner cam follower attached to one of the plates of the device;
    (e) a support plate for retaining a printed circuit board between, and substantially parallel to, the first and second plates;
    (f) a plurality of vertical test probes disposed in the first plate such that the test probes contact a trace on a circuit board disposed on the support plate when the plates are in the proximal plate position; and
    (g) a plurality of test probes disposed in the second plate.

9. The device of claim 8 wherein the device comprises a first vertical wall and an opposed second vertical wall and wherein a plurality of vertical grooves is defined in both the first and second vertical walls, each vertical groove being dimensioned and configured to retain an outer cam follower disposed adjacent to an inner cam follower, so that, when the cam bars are reciprocated by the motor, the interaction of the inner cam followers within the cams and the outer cam followers within the vertical groove causes the plates to move relative to one another between the distal plate position and the proximal plate position.

10. The device of claim 9 wherein the device further comprises a first cam moiety disposed at an angle with respect to a line parallel with the movement of the bars of between about 35° and about 55°, and a second cam moiety disposed at an angle with respect to a line parallel with the movement of the cam plate between about 3° and about 15°.

* * * * *